United States Patent
Yonezawa et al.

(10) Patent No.: US 12,428,727 B2
(45) Date of Patent: Sep. 30, 2025

(54) CYCLIC FILM DEPOSITION USING REDUCTANT GAS

(71) Applicant: Tokyo Electron Limited, Tokyo (JP)

(72) Inventors: Ryota Yonezawa, Albany, NY (US); Takamichi Kikuchi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 67 days.

(21) Appl. No.: 18/323,591

(22) Filed: May 25, 2023

(65) Prior Publication Data

US 2023/0399743 A1     Dec. 14, 2023

Related U.S. Application Data

(60) Provisional application No. 63/351,592, filed on Jun. 13, 2022.

(51) Int. Cl.
*C23C 16/34*     (2006.01)
*C23C 16/455*    (2006.01)

(52) U.S. Cl.
CPC ........ *C23C 16/45527* (2013.01); *C23C 16/34* (2013.01)

(58) Field of Classification Search
CPC .......................... C23C 16/34; C23C 16/45527
See application file for complete search history.

(56) References Cited

U.S. PATENT DOCUMENTS

| 6,706,115 B2 * | 3/2004 | Leskela ................... C23C 16/34 117/88 |
| 8,314,021 B2 | 11/2012 | Cho et al. |
| 2004/0004245 A1 * | 1/2004 | Forbes ................... H10B 69/00 257/315 |

(Continued)

FOREIGN PATENT DOCUMENTS

| JP | 2007-243105 | * | 9/2007 | ............. H01L 29/78 |
| KR | 20100051994 A | | 5/2010 | |
| KR | 20110111730 A | | 10/2011 | |

OTHER PUBLICATIONS

Burton, B.B., et al., "Tantalum Nitride Atomic Layer Deposition Using (tert-Butylimido)tris(diethylamido) tantalum and Hydrazine". Journal of The Electrochemical Society, 155 7 D508-D516 (2008).*

(Continued)

*Primary Examiner* — Bret P Chen
(74) *Attorney, Agent, or Firm* — Slater Matsil, LLP

(57) ABSTRACT

A method for depositing a film on a substrate disposed in a processing chamber includes repeating a cycle. The cycle includes a precursor step and a reactant step, and may include purge steps. A reductant step is performed during at least a portion of the cycle. The precursor step includes exposing the substrate to a precursor gas to form an intermediate film from the precursor gas at the substrate. The precursor gas may be a metal halide gas, such as titanium tetrachloride gas. The reactant step includes exposing the substrate to a reactant gas to chemically react with the intermediate film to form the film. The reactant gas may be a hydronitrogen gas having at least two nitrogen atoms, such as hydrazine gas. The reductant step includes exposing the substrate to a reductant gas, such as a gas containing hydrogen, like hydrogen gas.

20 Claims, 9 Drawing Sheets

(56) References Cited

U.S. PATENT DOCUMENTS

| | | | |
|---|---|---|---|
| 2008/0182410 A1* | 7/2008 | Elers | H01L 21/28562 257/E21.171 |
| 2010/0102417 A1 | 4/2010 | Ganguli et al. | |
| 2011/0124192 A1* | 5/2011 | Ganguli | H01L 21/76855 438/653 |
| 2015/0004316 A1 | 1/2015 | Thompson et al. | |
| 2018/0122642 A1* | 5/2018 | Raisanen | C23C 16/45527 |
| 2018/0269065 A1 | 9/2018 | Zhang et al. | |
| 2019/0161507 A1* | 5/2019 | Sanchez | C23C 16/45553 |
| 2019/0304790 A1* | 10/2019 | Mousa | H01L 21/02205 |

OTHER PUBLICATIONS

Abdulagatov, A.I., et al., "Atomic Layer Deposition of Aluminum Nitride Using Tris(diethylamido)aluminum and Hydrazine or Ammonia". Russian Microelectronics, 2018, vol. 47, No. 2, pp. 118-130.*

Jung, Yong Chan, et al., "Low Temperature Thermal Atomic Layer Deposition of Aluminum Nitride Using Hydrazine as the Nitrogen Source". Materials 2020, 13, 3387, pp. 1-10.*

Vos, Martijn F.J., et al., "Atomic Layer Deposition of Cobalt Using H 2-, N 2-, and NH3-BasedPlasmas: On the Role of the Co-reactant". J. Phys. Chem. C 2018, 122, 22519-22529.*

Hayashi, Y., et al., "Modification of electrical and optical properties of metal nitride thin films by hydrogen inclusion". Journal of Alloys and Compounds 330-332 (2002) 348-351.*

Muschoot, J., et al., "Atomic layer deposition of titanium nitride from TDMAT precursor". Microelectronic Engineering, 86 (2009) 72-77.*

International Searching Authority, "Notification of Transmittal of the International Search Report and the Written Opinion of the International Searching Authority, or The Declaration," International Application No. PCT/US2023/023989, Sep. 15, 2023, 10 pages.

* cited by examiner

CYCLIC FILM DEPOSITION USING REDUCTANT GAS

CROSS-REFERENCE TO RELATED APPLICATIONS

This application claims priority to U.S. Provisional Application No. 63/351,592, filed on Jun. 13, 2022, which application is hereby incorporated by reference in its entirety.

TECHNICAL FIELD

The present invention relates generally to systems and methods for film deposition and, in particular embodiments, to systems and methods for cyclic film deposition processes using a reductant gas.

BACKGROUND

Generally, a microelectronic device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. There is a growing need for thinner films deposited with greater precision as device size decreases and device density increases.

One method of depositing precision thin films is atomic layer deposition (ALD). ALD processes deposit a film on a substrate by growing the film layer-by-layer using a cyclic process of reactive steps. During each reactive step, a precursor is introduced in a gaseous state. The precursor reacts chemically with the surface until all thermodynamically favorable reaction sites are gone. In this way, each reactive step of the ALD process is self-limiting. Purge steps are also included between the reactive steps so that only one precursor is present at a time.

A wide variety of materials may be deposited using ALD processes, including both pure materials and compound materials. For example, ALD processes may be used to form pure metal films such as aluminum (Al), titanium (Ti), chromium (Cr), cobalt (Co), and others. ALD processes have also been used to combine many pure material elements such as fluorine (F), nitrogen (N), oxygen (O), and sulfur (S) to form compound materials.

The thermal budget of various substrates can be relatively low, requiring film deposition at lower temperatures to avoid damage to existing layers of the substrate. However, film properties for films deposited at lower temperatures may be undesirable. For example, conventional TiN atomic layer deposition (ALD) using alternating exposures of $TiCl_4$ and $NH_3$ shows significant degradation in deposition rate and resistivity at substrate temperatures below 350° C. Therefore, new methods are needed to overcome these problems.

SUMMARY

In accordance with an embodiment of the invention, a method for depositing a metal nitride film on a substrate disposed in a processing chamber includes repeating a cycle including a precursor step of exposing the substrate to a metal halide gas to form an intermediate film from the metal halide gas at the substrate, and a reactant step of exposing the substrate to a hydronitrogen gas to chemically react with the intermediate film to form the metal nitride film. The hydronitrogen gas has a chemical formula of $N_mH_n$ where $m>1$. The method further includes a reductant step of exposing the substrate to hydrogen gas ($H_2$) during at least a portion of each cycle.

In accordance with another embodiment of the invention, a method for depositing a film on a substrate disposed in a processing chamber includes repeating a cycle including a precursor step of exposing the substrate to a precursor gas including a metal to form an intermediate film including the metal at the substrate, a precursor purge step of purging the processing chamber after the precursor step, a reactant step of exposing the substrate to a reactant gas including hydrogen and an additional material to chemically react with the intermediate film to form a deposited film, and a reactant purge step of purging the processing chamber after the reactant step. The deposited film includes the metal and the additional material. The method further includes a reductant step of exposing the substrate to hydrogen gas ($H_2$) during at least a portion of each cycle, and maintaining the substrate at a temperature of about 300° C. or less for the duration of each cycle.

In accordance with still another embodiment of the invention, a method for depositing a titanium nitride film on a substrate disposed in a processing chamber includes repeating a cycle including a precursor step of exposing the substrate to titanium tetrachloride gas ($TiCl_4$) to form an intermediate film including titanium and chlorine at the substrate, a precursor purge step of purging the processing chamber after the precursor step, a reactant step of exposing the substrate to a hydrazine gas ($N_2H_4$) to chemically react with the intermediate film to form the titanium nitride film, and a reactant purge step of purging the processing chamber after the reactant step. The method further includes a reductant step of exposing the substrate to hydrogen gas ($H_2$) during at least a portion of each cycle, and maintaining the substrate at a temperature of about 300° C. or less for the duration of each cycle.

BRIEF DESCRIPTION OF THE DRAWINGS

For a more complete understanding of the present invention, and the advantages thereof, reference is now made to the following descriptions taken in conjunction with the accompanying drawings, in which.

Figure 1:
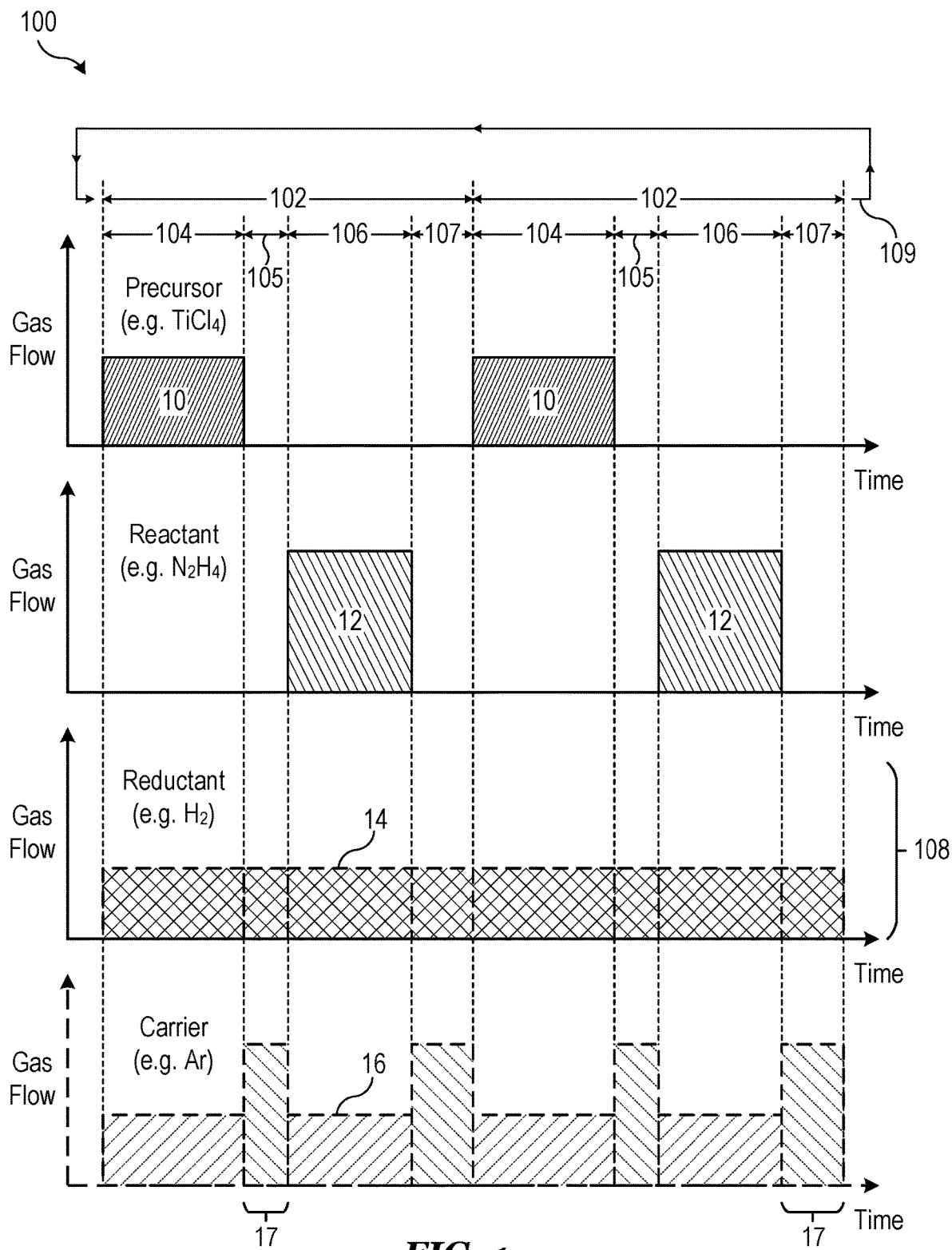
FIG. 1 illustrates an example method for depositing a film using a cycle that includes a precursor step and a reactant step, where a reductant step is performed during at least a portion of the cycle in accordance with embodiments of the invention.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope. Unless specified otherwise, the expressions "around", and "substantially" signify within 10%, and preferably within 5% of the given value or, such as in the case of substantially zero, less than 10% and preferably less than 5% of a comparable quantity.

Film quality during microelectronic device fabrication is an important factor in producing high quality devices with high yield. Some applications for a material may be infeasible without achieving a particular film quality. Additionally, properties of a deposited film may change depending on process conditions during film deposition. This may allow control over some film properties. Yet, process parameters are frequently subject to more considerations that just the film quality. There may also be trade-offs in film properties between different process parameter sets. Consequently, it can be difficult to achieve a target film quality or set of film properties.

Temperature is one example of a process parameter that is subject to additional considerations. Structures on the substrate may be sensitive to elevated temperatures, for example. But conventional methods of film deposition using cyclic processes (e.g., ALD) have degraded film properties when deposited at lower temperatures (e.g., when plasma-enhanced ALD (PE-ALD) is not feasible and only thermal ALD can be used). In particular, the quality of the film may decrease proportionally with the deposition temperature. One example is the resistivity of the film, which may need to low for certain applications. At higher deposition temperatures, the resistivity may be desirably lower, while lower temperature deposition results in undesirable higher resistivity.

In a specific example, titanium nitride (TiN) may be deposited using a cyclic film deposition process. One conventional method for depositing a titanium nitride TiN film includes repeated alternating exposures of titanium tetrachloride ($TiCl_4$) and ammonia ($NH_3$), with purge steps between the exposures. Another known method for TiN film deposition includes repeated alternating exposures of $TiCl_4$ and hydrazine ($N_2H_4$), with purge steps between the exposures. However, these known methods do not have the desired properties when deposited at lower temperatures (e.g., at temperatures of about 300° C. or less). For example, such conventional TiN films have a resistivity higher than 350 µΩ·cm.

In various embodiments, the invention improves film quality for cyclic film deposition processes by including a reductant gas during at least a portion of each cycle. In various embodiments, a method for depositing a film on a substrate in a processing chamber includes repeating a cycle including a precursor step and a reactant step. During the precursor step, the substrate is exposed to a precursor gas (e.g., including a metal) to form an intermediate film at the substrate. The intermediate film includes material from the precursor gas (e.g., the metal). During the reactant step, the substrate is exposed to a reactant gas (e.g., including hydrogen) to chemically react with the intermediate film and form the deposited film.

The method for depositing the film also includes a reductant step during which the substrate is exposed to a reductant gas during at least a portion of each cycle. For example, the reductant step may be performed concurrently with the precursor step, with the reactant step, or with both steps. Additionally, the cycle may also include purge steps. For example, a precursor purge step may be performed after the precursor step and/or a reactant purge step may be performed after the reactant step. A purge gas (or gases) may be used during the purge step. For example, a carrier gas may be provided into the processing chamber during a purge step without supplying a precursor gas/reactant gas.

In various embodiments, the method for depositing the film is performed at a lower temperature. For example, during the duration of each cycle, the substrate may be maintained at the lower temperature, such as at about 300° C. or less. The method for depositing the film may be an ALD process, and is a thermal ALD process in one embodiment.

The deposited film may be many suitable films. In some embodiments, the deposited film is a nitride film, and is a TiN in one embodiment. The precursor gas may include a metal and is a metal halide gas in some embodiments. In one embodiment, the precursor gas is titanium tetrachloride ($TiCl_4$), but other precursor gases are also possible. The reactant gas includes hydrogen in various embodiments and is a hydronitrogen gas having the formula $N_mH_n$ where m>1 in some embodiments. One such hydronitrogen gas is hydrazine ($N_2H_4$), but others are possible. The reductant gas may interact with species in the processing chamber and/or at the substrate to improve film quality or alter film properties during the cycle. In one embodiment, the reductant gas is hydrogen gas ($H_2$). Other reductant gases may also be suitable, the choice of which may depend on the composition of the deposited film, the precursor gas, and/or the reactant gas.

Various embodiments may advantageously improve (e.g., lower) film resistivity for films deposited at lower temperatures. The ability to control the composition, timing, and flowrate of the reductant gas may also provide the advantage of improved control over the cyclic deposition process. The ability to deposit higher quality films at lower temperature may advantageously allow the films to be used in more applications, such as back end of line (BEOL) applications, for example. The embodiments described herein may also provide the benefit of enabling purely thermal deposition of films that would otherwise require plasma enhancement to achieve desired film properties.

Embodiments provided below describe various systems and methods for film deposition, and in particular, systems and methods for cyclic film deposition processes using a reductant gas. The following description describes the embodiments. FIG. 1 is used to describe an example method for depositing a film on a substrate. A more detailed example method of depositing a film is described using FIG. 2. Three more example methods for depositing a film are described using FIGS. 3-5. An example graph of film resistivity as a function of process temperature and gas type is shown and described using FIG. 6. An example system for depositing a film on a substrate is described using FIG. 7. Two more qualitative example graphs of film resistivity as a function of process parameters are shown and described using FIGS. 8 and 9. Three more example methods of depositing a film are described using FIGS. 10-12.

FIG. 1 illustrates an example method for depositing a film using a cycle that includes a precursor step and a reactant step, where a reductant step is performed during at least a portion of the cycle in accordance with embodiments of the invention.

Referring to FIG. 1, a method 100 for depositing a film on a substrate includes a cycle 102 that is repeated in order to form the film. For example, the cycle 102 is repeated at least once as shown, but may be repeated as many times as desired (as illustrated by the arrow return path 109) to deposit the film at the desired thickness on the substrate. In various embodiments, the method 100 is a layer-by-layer deposition process during which layers of the film are built up using discrete processing steps. In various embodiments, the method 100 is an ALD process and is a thermal ALD process in one embodiment. In one embodiment, the method 100 is a PE-ALD process. In other embodiments, the method 100 is a molecular layer deposition (MLD) process.

Each layer may be very thin, such as an atomic layer (e.g., ALD) or a molecular layer (e.g., MLD). The processing steps may be self-limiting or pseudo-self-limiting which may facilitate defined endpoints for the formation of each layer and improve control over both film composition and film thickness.

The cycle 102 includes a precursor step 104 of exposing the substrate to a precursor gas 10. The substrate is exposed to the precursor gas 10 for a predetermined duration and the precursor gas 10 is provided with a predetermined flowrate in order to form an intermediate film at the substrate. For example, when the precursor step 104 is performed as the first step of the method 100, the precursor gas 10 forms an intermediate film from the precursor gas 10 that includes a component of the precursor gas 10. The duration of the precursor step 104 may be referred to as the precursor exposure time.

The cycle 102 further includes a reactant step 106 of exposing the substrate (i.e., including any intermediate films) to a reactant gas 12 for a predetermined duration and flowrate. The reactant gas 12 reacts chemically with the intermediate film to form a deposited film that includes a component of the reactant gas 12. As with the precursor step 104, the duration of the reactant step 106 may be referred to as the reactant exposure time.

The precursor gas 10 may be selected such that it may form a film that reacts with the reactant gas 12 to form the desired deposited film. In some embodiments, the precursor gas 10 includes a metal, and the precursor gas 10 is a metal halide in some embodiments. For example, the precursor gas 10 may include one or more of any suitable metal, such as titanium (Ti), tantalum (Ta), aluminum (Al), platinum (Pt), zinc (Zn), hafnium (Hf), indium (In), germanium (Ge), silicon (Si), ruthenium (Ru), and others. The precursor gas 10 may also include one or more of any suitable halogen, such as fluorine (F), chlorine (Cl), bromine (Br), and iodine (I).

In one embodiment, the precursor gas 10 is titanium tetrachloride ($TiCl_4$). In another embodiment, the precursor gas 10 is titanium tetrabromide ($TiBr_4$). In still another embodiment, the precursor gas 10 is tantalum pentachloride ($TaCl_5$). Of course, the precursor gas 10 may be other suitable compounds and may include additional or alternative elements not listed here as may be apparent to one of ordinary skill in the art.

The reactant gas 12 may be selected such that it may form a desired deposited film on the substrate by reacting with the precursor gas 10. The reactant gas 12 includes hydrogen (H) in one embodiment. In various embodiments, the reactant gas 12 includes nitrogen (N) (e.g., when depositing a nitride such as TiN), and the reactant gas 12 is a hydronitrogen gas in some embodiments. For example, the reactant gas 12 is a hydronitrogen gas having the chemical formula of $N_mH_n$ where m>1 in some embodiments. The reactant gas 12 may be an azane, and the reactant gas 12 is a noncyclic azane with n=m+2 in the preceding formula in various embodiments. In one embodiment, the reactant gas 12 is hydrazine ($N_2H_4$). In another embodiment, the reactant gas 12 is triazane ($N_3H_5$).

The reactant gas 12 may include oxygen (O) (e.g., when depositing an oxide, such as aluminum oxide ($Al_2O_3$)). For example, the reactant gas 12 is water vapor ($H_2O$) in one embodiment. In another embodiment, the reactant gas 12 is hydrogen peroxide ($H_2O_2$). Of course, the reactant gas 12 may also be other compounds and may include additional or alternative elements not listed as may be apparent to one of ordinary skill in the art.

The cycle 102 also includes a reductant step 108 of exposing the substrate to an additional gas (i.e., a reductant gas 14, such as hydrogen gas ($H_2$), for example) during at least a portion of each cycle 102. The reductant gas 14 may help to improve the formation of the deposited film aiding in the removal of surplus species from the substrate, film, and/or processing chamber (e.g., a halogen, such as Cl, for example) or by enhancing the desired chemical reactions between the intermediate film and the reactant gas 12 or between the deposited film and the precursor gas 10. The reductant gas 14 may also react with species in the processing to form byproducts that are more easily removed from the processing chamber (e.g., during purge steps when included, discussed in more detail in the following).

Although shown as $H_2$ gas here, the reductant gas 14 may be a different gas in other applications. In situations, where the chemical reaction between an intermediate film formed by the precursor gas 10 and the reactant gas 12 involve hydrogen, the reductant gas 14 may be compound including one or more hydrogen atoms. Some examples might be $NH_3$, $N_2H_4$, $N_3H_5$, and others. However, it should be noted that the reductant gas 14 is different from the reactant gas 12 (although there may be overlap in what gases may be used for each in a given application).

The precursor gas 10 and/or the reactant gas 12 may be provided to the substrate along with a carrier gas 16. The carrier gas 16 may enhance the delivery of reactive gases such as the precursor gas 10 and the reactant gas 12 to the substrate (e.g., when the flowrate of the reactive gases is somewhat low). The carrier gas 16 may be selected such that it does not react with the other gases, films, or substrate. For example, the carrier gas 16 may be a noble gas or other inert gas. In one embodiment, the carrier gas 16 is argon (Ar). In another embodiment, the carrier gas 16 is nitrogen ($N_2$). In still another embodiment, the carrier gas 16 is xenon (Xe).

In addition to the precursor step 104 and the reactant step 106, the cycle 102 may also include one or both of a precursor purge step 105 and a reactant purge step 107. For example, during the precursor purge step 105, the precursor gas 10 may not be provided while one or more other gases (i.e. a purge gas 17) is provided to the processing chamber in order to remove the precursor gas 10 and byproducts in preparation for the reactant step 106 that follows. Similarly, during the reactant purge step 107, the reactant gas 12 may not be provided while the purge gas 17 (not necessarily the same as in the precursor purge step 105, when included, but may be the same) is provided to the processing chamber to remove the reactant gas 12 and byproducts in preparation for the precursor step 104 of the round of the cycle 102.

The purge gas 17 may be any suitable gas (e.g., that does not react with the film or substrate, but may react with surplus species in the processing chamber and form byproducts). In some cases, such as shown in FIG. 1, the purge gas 17 may be or include the carrier gas 16. Additional gases may also be used instead of or included with the carrier gas 16, such as the reductant gas 14. In some cases when the carrier gas 16 is included the precursor step 104 and/or the reactant step 106 and used during a purge step, the flowrate of the carrier gas 16 may be increased during the purge step, as qualitatively shown. However, in other cases the flowrate of the carrier gas 16 may remain constant. For that matter, the flowrate of any of the gases may change or be adjusted from between steps and between cycles, either as part of the recipe or for fine tuning based on metrology of the processing chamber and the film.

The reductant gas 14 (e.g., $H_2$ gas) may be provided during any (or all) of the steps in the cycle 102. In one example, the reductant gas 14 is provided only during the precursor step 104 (e.g., with $TiCl_4$ gas). In another example the reductant gas 14 is provided only during the reactant step 106 (e.g., with $N_2H_4$ gas). In yet another example, the reductant gas 14 is provided during both the precursor step 104 and the reactant step 106. In another example, the reductant gas 14 is provided throughout the entirety of the cycle 102 (as shown, although the flowrate of the reductant gas 14 may be different between steps).

Because the reductant gas 14 may advantageously improve the film quality, the method 100 may be performed at lower temperatures than conventional methods while still attaining desired film properties. According to some embodiments, the substrate may be maintained at a temperature of about 300° C. or less, such as between about 250° C. and about 300° C. For example, the substrate may be maintained at a temperature range of about 20° C. that is less than about 300° C., such as between about 280° C. and about 300° C. or between about 260° C. and about 280° C., a temperature range of about 30° C. such as between about 270° C. and about 290° C. or between about 260° C. and about 290° C., and so on. In one embodiment, the substrate temperature is maintained at about 280° C. But the exact temperature may depend on the details of the specific application as may be apparent to one of ordinary skill in the art.

Figure 2:
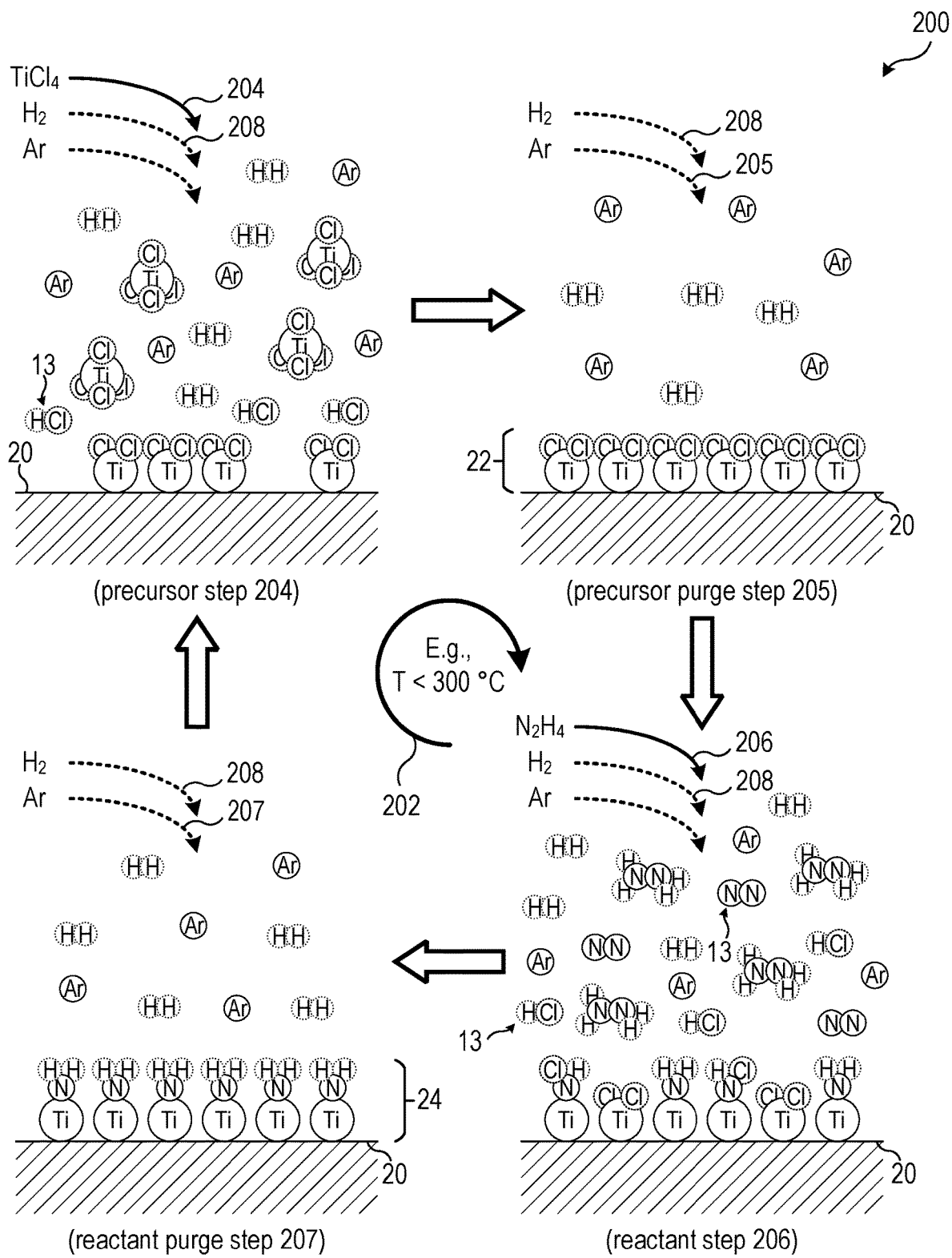
FIG. 2 illustrates an example method for depositing a titanium nitride film using a cycle that includes a precursor step, a precursor purge step, a reactant step, and a reactant purge step, where a reductant step is performed during at least a portion of the cycle in accordance with embodiments of the invention.

FIG. 2 illustrates an example method for depositing a titanium nitride film using a cycle that includes a precursor step, a precursor purge step, a reactant step, and a reactant purge step, where a reductant step is performed during at least a portion of the cycle in accordance with embodiments of the invention. The method of FIG. 2 may be a specific implementation of other methods described herein such as the method of FIG. 1, for example. Similarly labeled elements may be as previously described.

Referring to FIG. 2, a method 200 for depositing a titanium nitride film includes a cycle 202 including a precursor step 204, a precursor purge step 205, a reactant step 206, and a reactant purge step 207. It should be noted that here and in the following a convention has been adopted for brevity and clarity wherein elements adhering to the pattern [x02] where 'x' is the figure number may be related implementations of a cycle in various embodiments. For example, the cycle 202 may be similar to the cycle 102 except as otherwise stated. An analogous convention has also been adopted for other elements as made clear by the use of similar terms in conjunction with the aforementioned numbering system.

The precursor step 204 includes providing $TiCl_4$ gas (precursor gas) to a substrate 20. Other gases may also be provided along with the $TiCl_4$ gas. For example, a carrier gas (such as argon gas, shown here, $N_2$ gas, etc.) may be included during the precursor step 204. A reductant gas (e.g., $H_2$ gas, as shown) may also be included. The $TiCl_4$ gas reacts with the substrate 20 and forms an intermediate film that includes Ti on the surface of the substrate 20. In the specific interaction of the $TiCl_4$ with the substrate 20 shown here, each Ti atom bonds to the substrate 20 and keeps two Cl atoms, while the remaining two Cl atoms are removed (e.g., through an exhaust port of the processing chamber. When $H_2$ gas is included in the precursor step 204, hydrogen chloride gas (HCl) may be formed and exhausted as a byproduct 13 (for example, HCl or $N_2$ as shown).

After the precursor step 204, no $TiCl_4$ (precursor gas) is provided into the processing chamber while one or more gases (i.e. a purge gas) are provided during the precursor purge step 205. For example, as shown, a less-reactive gas (e.g., an inert gas, such as Ar) may be included in the purge gas. The less-reactive gas may be the same gas used as a carrier gas in the precursor step 204. Additionally or alternatively, another gas may be provided, such as $H_2$ gas, which may beneficially enhance the purging of undesirable species during the precursor purge step 205.

Following the precursor purge step 205, a reactant step 206 includes providing $N_2H_4$ gas (hydrazine) into the processing chamber to expose the intermediate film 22 to the $N_2H_4$ gas. The $N_2H_4$ gas chemically reacts with the intermediate film 22 and replaces the chlorine bonded to the titanium with nitrogen to form TiN (titanium nitride) at the substrate 20. After the reactant step 206 is performed for a sufficient duration time (i.e., exposure time of the $N_2H_4$ gas to the intermediate film 22), a first layer of a deposited film 24 (here, a TiN) film is formed.

As with the precursor step 204, a reactant purge step 207 is performed after the reactant step 206 during which no $N_2H_4$ gas is provided, but a purge gas including one or more gases is provided. Similar to the precursor purge step 205, the purge gas may include an inert gas, (e.g., Ar, $N_2$, Xe, etc.) and/or additional gases, such as $H_2$ gas, other reductant gases, other carrier gases, and the like.

The reactant purge step 207 may advantageously improve the film quality going into the next step of the cycle 202, such as by removing excess chlorine. For example, as shown, chlorine may be bonded to some of the nitrogen in the TiN pairs of the film. The $H_2$ gas of the reactant purge step 207 (and of other steps when included) may react with or enhance removal of the chlorine in the film to improve the quality of the deposited film 24, such as by decreasing resistivity of the film.

Including $H_2$ gas during one or more of the steps of the cycle 202 may allow the method 200 for depositing the TiN film to be effective at lower processing temperatures. For example, during the cycle 202 the substrate 20 may be maintained at a temperature of about 300° C. or less. In various embodiments, the substrate 20 is maintained within a desired temperature range below about 300° C. In one embodiment, the substrate 20 is maintained at a temperature of about 280° C.

Figure 3:
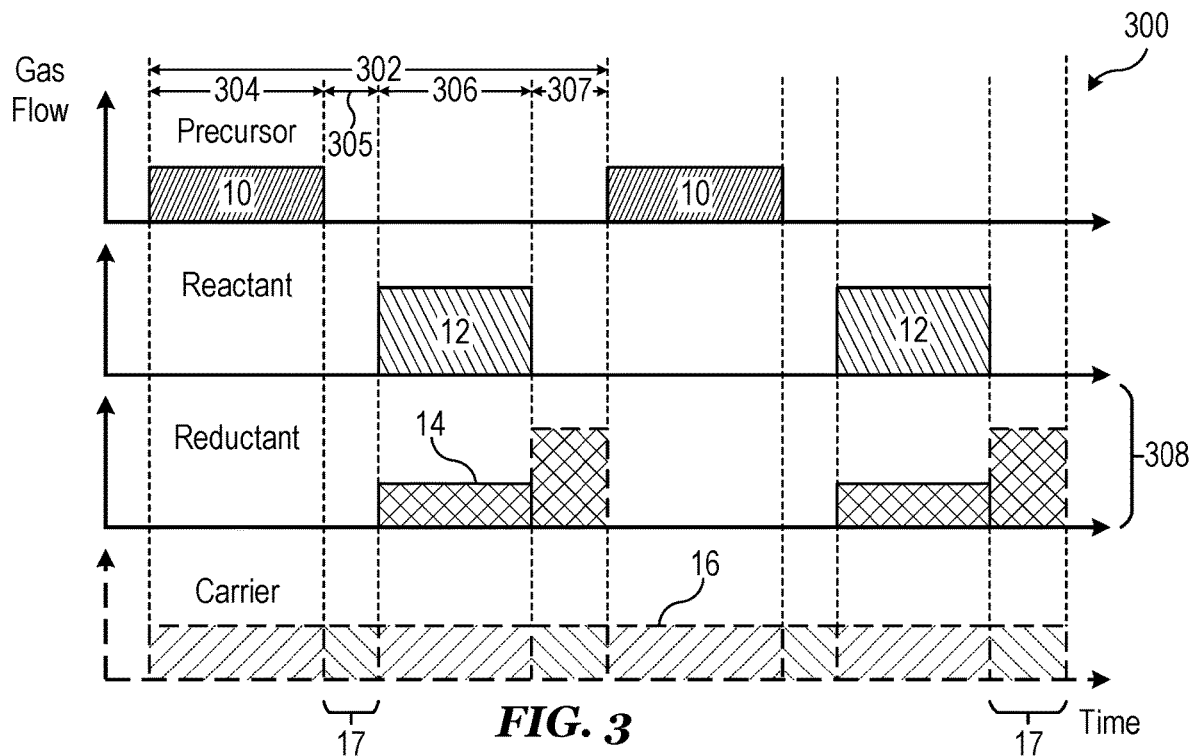
FIG. 3 illustrates an example method for depositing a film using a cycle that includes a precursor step and a reactant step, where a reductant step is performed during at least the reactant step of the cycle in accordance with embodiments of the invention.

FIG. 3 illustrates an example method for depositing a film using a cycle that includes a precursor step and a reactant step, where a reductant step is performed during at least the reactant step of the cycle in accordance with embodiments of the invention. The method of FIG. 3 may be a specific implementation of other methods described herein such as the method of FIG. 1, for example. Similarly labeled elements may be as previously described.

Referring to FIG. 3, a method 300 for depositing a film includes a cycle 302 that includes a precursor step 304, a precursor purge step 305, a reactant step 306, and a reactant purge step 307. A reductant step 308 is also included during which a reductant gas 14 is provided during the reactant step 306. As discussed in the foregoing, the reductant gas 14 may be $H_2$ gas, for example.

As shown, the reductant gas 14 of the reductant step 308 may also be provided during the reactant purge step 307. As previously discussed, the flowrate of the reductant gas 14 may be substantially constant across steps, but there is no requirement that the flowrate of the reductant gas 14 remain constant during each step of the cycle 302. For example, the flowrate of the reductant gas 14 may be increased during the reactant purge step 307 relative to the reactant step 306 (or other steps that concurrently performed with the reductant step 308) as illustrated. Of course, the opposite may also be true in some applications (higher flowrate during the reactant step 306 relative to the reactant purge step 307).

Figure 4:
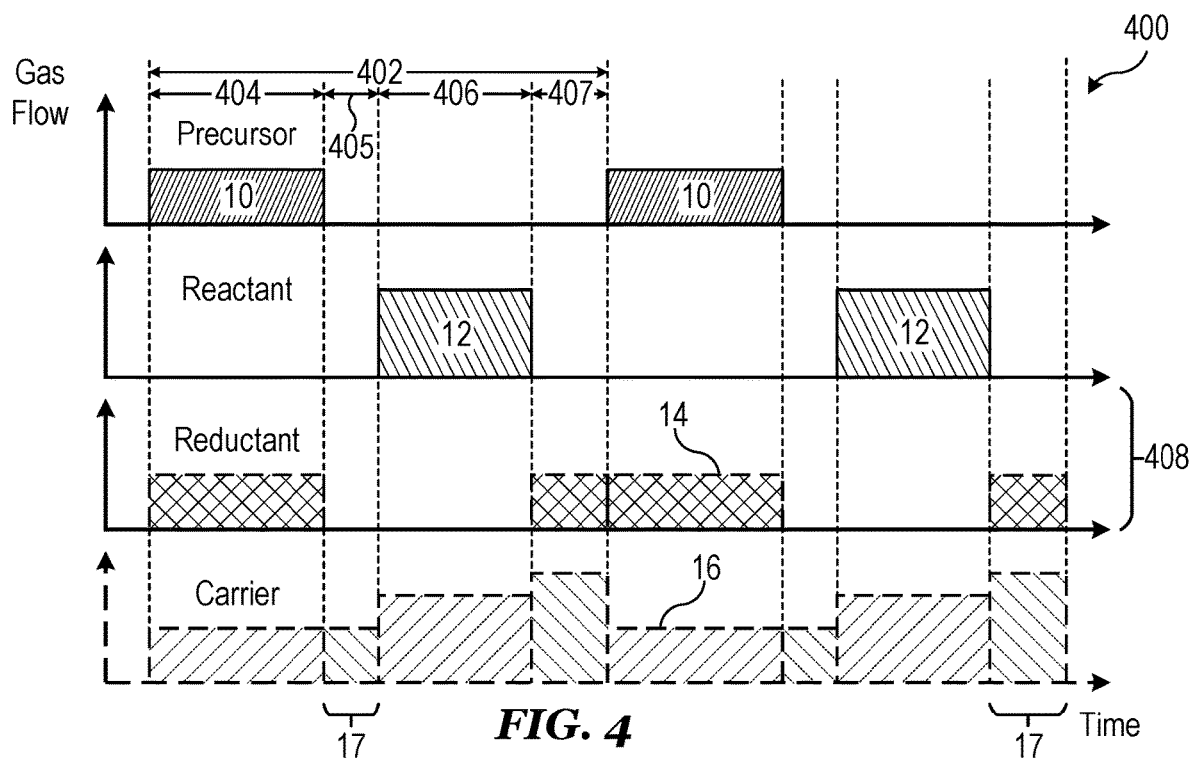
FIG. 4 illustrates an example method for depositing a film using a cycle that includes a precursor step and a reactant step, where a reductant step is performed during at least the precursor step of the cycle in accordance with embodiments of the invention.

FIG. 4 illustrates an example method for depositing a film using a cycle that includes a precursor step and a reactant step, where a reductant step is performed during at least the precursor step of the cycle in accordance with embodiments of the invention. The method of FIG. 4 may be a specific implementation of other methods described herein such as the method of FIG. 1, for example. Similarly labeled elements may be as previously described.

Referring to FIG. 4, a method 400 for depositing a film includes a cycle 402 that includes a precursor step 404, a precursor purge step 405, a reactant step 406, and a reactant purge step 407. A reductant step 408 is also included during which a reductant gas 14 may be provided during the precursor step 404 and/or the reactant purge step 407. Therefore, in contrast to the previous method, the reductant step 408 may be performed concurrently with the precursor step 404, with the reactant purge step 407, or with both the precursor step 404 and the reactant purge step 407.

As already discussed, a carrier gas 16 may be provided during one or more of the steps of the cycle 402. For example, the carrier gas 16 may be included to aid in delivering reactive gases (i.e. the precursor gas 10 and/or the reactant gas 12 to the film/substrate) and/or included in the purge gas 17 during one or more purge steps. As with other gases, the flowrate of the carrier gas 16 may also change from step to step or cycle to cycle. For illustrative purposes, the carrier gas 16 is shown here as being substantially constant between the precursor step 404 and the precursor purge step 405, but is increased during the reactant step 406 and then increased again during the reactant purge step 407. Of course, this is merely one example, and others are possible as may be apparent to one of ordinary skill in the art.

Figure 5:
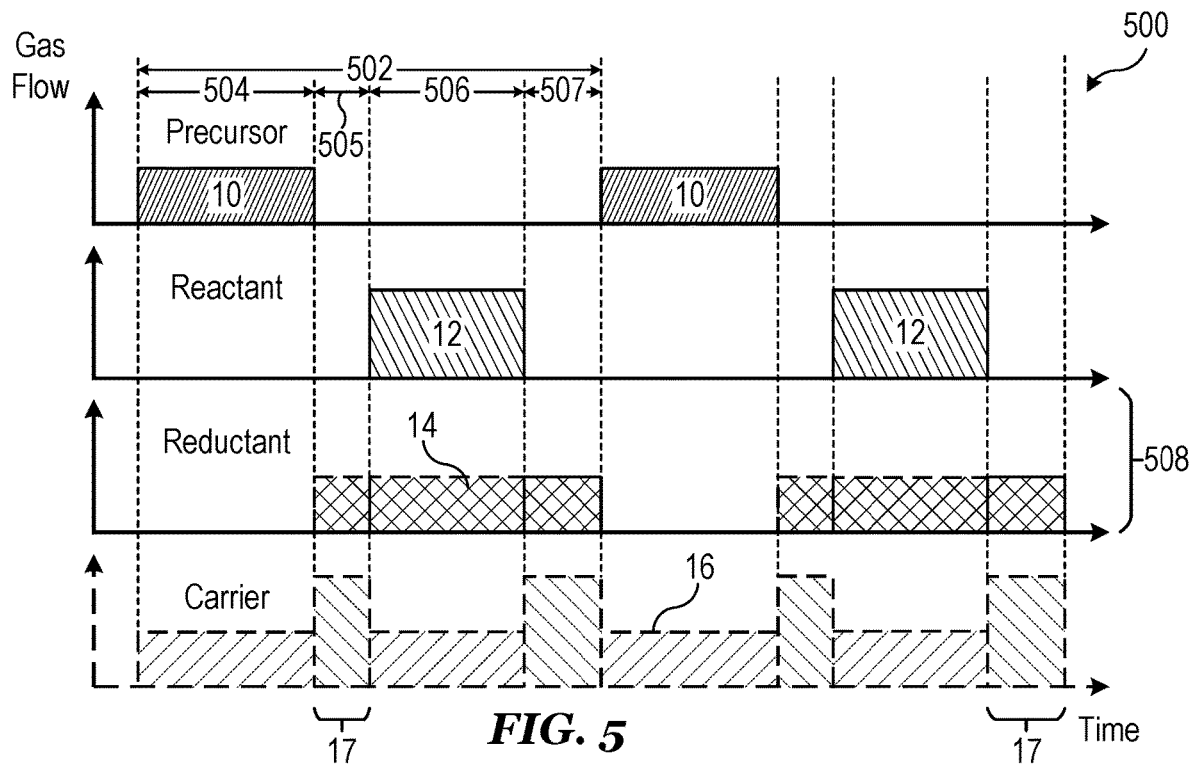
FIG. 5 illustrates an example method for depositing a film using a cycle that includes a precursor step and a reactant step, where a reductant step is performed during at least the reactant purge step of the cycle in accordance with embodiments of the invention.

FIG. 5 illustrates an example method for depositing a film using a cycle that includes a precursor step and a reactant step, where a reductant step is performed during at least the reactant purge step of the cycle in accordance with embodiments of the invention. The method of FIG. 5 may be a specific implementation of other methods described herein such as the method of FIG. 1, for example. Similarly labeled elements may be as previously described.

Referring to FIG. 5, a method 500 for depositing a film includes a cycle 502 that includes a precursor step 504, a precursor purge step 505, a reactant step 506, and a reactant purge step 507. A reductant step 508 is also included during which a reductant gas 14 is provided during the reactant step 506 and the reactant purge step 507. The reductant step 508 may also optionally be performed concurrently with the precursor purge step 505, as illustrated. As suggested in the description of FIG. 1, an analogous alternative is also possible where the reductant step 508 is performed concurrently with the precursor step 504 and the precursor purge step 505 and optionally with the reactant purge step 507.

Figure 6:
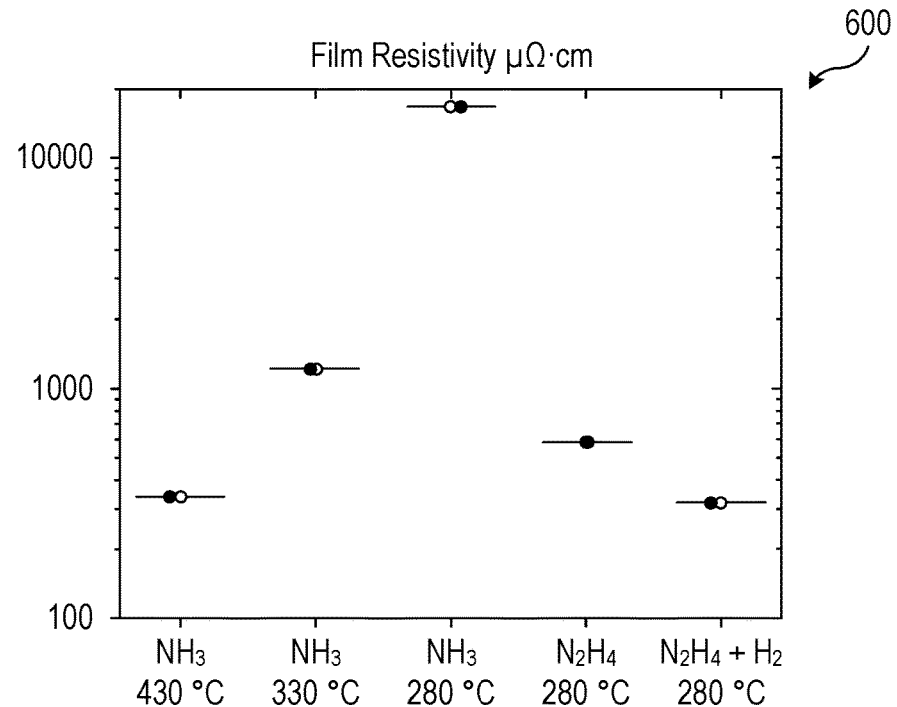
FIG. 6 illustrates an example graph of film resistivity as a function of process temperature and gas type in accordance with embodiments of the invention.

FIG. 6 illustrates an example graph of film resistivity as a function of process temperature and gas type in accordance with embodiments of the invention. Referring to FIG. 6, the graph 600 shows resistivity for five TiN films that were deposited using different reactants and conditions. The gaseous exposures were all performed without plasma excitation. The first TiN film (left) was deposited using alternating exposures of $TiCl_4$ and $NH_3$ at a substrate temperature of about 430° C. and had a measured resistivity of about 340 $\mu\Omega\cdot cm$. The second TiN film was deposited using alternating exposures of $TiCl_4$ and $NH_3$ at a substrate temperature of about 330° C. and had a measured resistivity greater than about 1,000 $\mu\Omega\cdot cm$. The third TiN film was deposited using alternating exposures of $TiCl_4$ and $NH_3$ at a substrate temperature of about 280° C. and had a measured resistivity greater than about 10,000 $\mu\Omega\cdot cm$. The fourth TiN film was deposited using alternating exposures of $TiCl_4$ and $N_2H_4$ (no $H_2$ gas) at a substrate temperature of about 280° C. and had a measured resistivity of about 600 $\mu\Omega\cdot cm$. The fifth TiN film (right) was deposited using alternating exposures of $TiCl_4$ and $N_2H_4$ (with $H_2$ gas during the $TiCl_4$ flow, the $N_2H_4$ flow, and the purge flows) at a substrate temperature of about 280° C. and had a measured resistivity of about 350 $\mu\Omega\cdot cm$.

Figure 7:
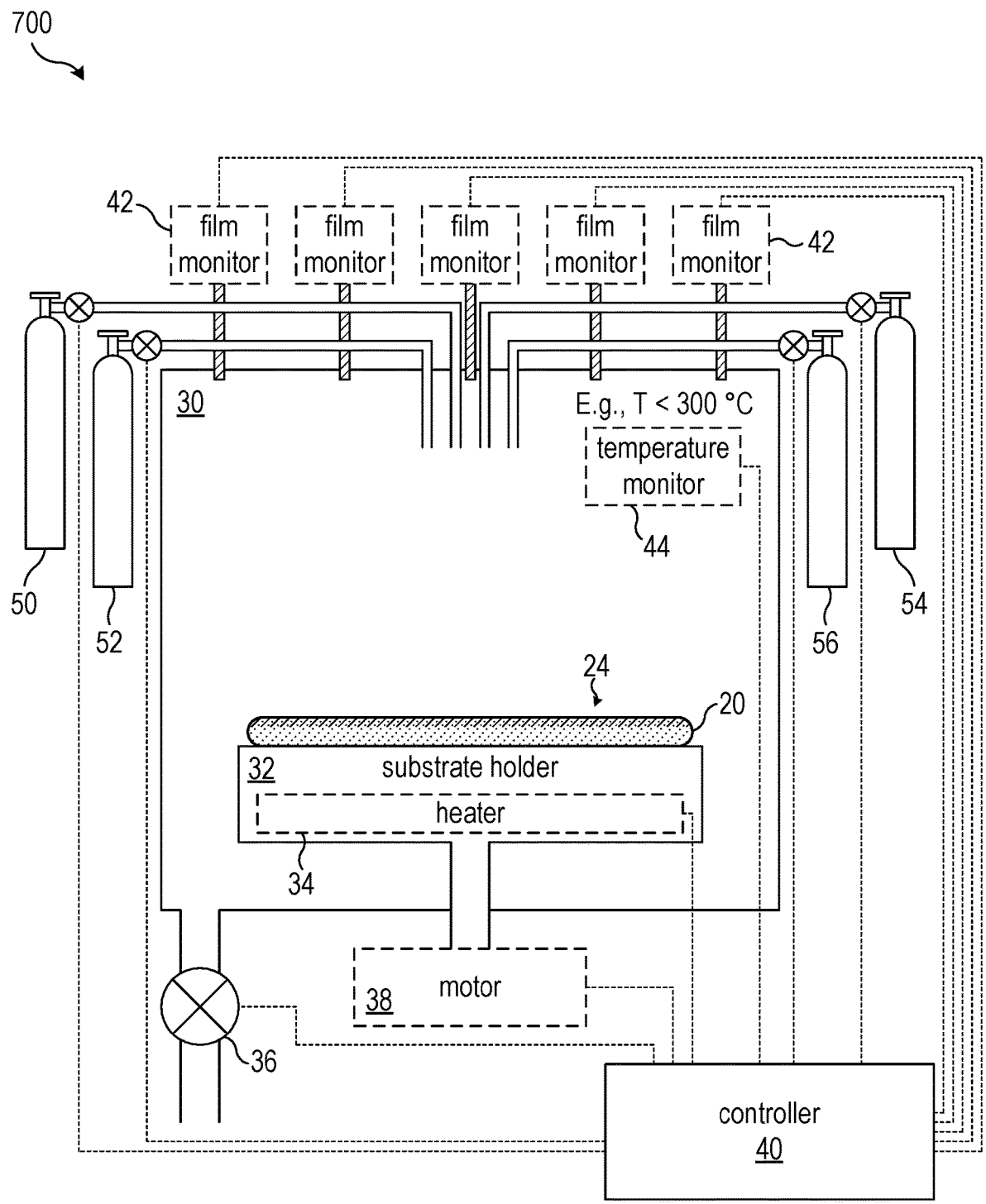
FIG. 7 illustrates an example system for depositing a film on a substrate disposed in a processing chamber, where the system includes a precursor gas source, a reactant gas source, and a reductant gas source in accordance with embodiments of the invention.

FIG. 7 illustrates an example system for depositing a film on a substrate disposed in a processing chamber, where the system includes a precursor gas source, a reactant gas source, and a reductant gas source in accordance with embodiments of the invention. The system of FIG. 7 may be used to perform any of the methods described herein such as the methods of FIGS. 1-5 and 10-12, for example. Similarly labeled elements may be as previously described.

Referring to FIG. 7, a system 700 for depositing a film 24 on a substrate 20 disposed in a processing chamber 30 includes a substrate holder 32 supporting the substrate 20 within the processing chamber 30. For example, the system 700 may be an ALD tool, an MLD tool, or the like. In various embodiments, the system 700 is an ALD tool and is a thermal ALD tool (i.e., not configured to produce or contain a plasma) in one embodiment. Of course, the system 700 may be a PE-ALD in some applications.

A controller 40 is coupled to various sensors and valves in the system 700. The sensors are configured to monitoring various parameters and may be configured to automatically adjusting one or more variables and/or process conditions of the system 700 or methods described herein to achieve a desired film composition and uniformity having desired film properties (i.e. film quality). Some examples of adjustable parameters include gas mixture ratios, gas timing and flowrates, exposure time, temperature (at various regions of the substrate 20, substrate holder 32, and/or in the processing chamber 30), substrate rotation, and others.

The sensors may be coupled to and located in and/or around the processing chamber 30. Various types of sensors may be included in the system 700 (depending, for example, on the specifics of a given application). For example, optical sensors (such as cameras, lasers, light, reflectometer, spectrometers, ellipsometric, etc.), capacitive sensors, ultrasonic sensors, gas sensors, or other sensors that may monitor a condition of the deposited film 24, the substrate 20, and/or the system 700.

In one specific example, one or more optical sensors may be used to measure the thickness and refractive index of the depositing film in real time. In another specific example, a spectrometer may be used to measure the film thickness of one or more layers provided on the substrate 20. In one embodiment, a residual gas analyzer (RGA) may be used to detect precursor (i.e. precursor gas and/or reactant gas) breakdown for real-time chemical reaction completion detection. This information may be advantageously used for adjusting the flow of the reductant gas (e.g., $H_2$ gas) during one or more steps of a cycle in order to achieve the desired film quality.

The controller 40 is configured to control the timing and flowrate of various source gases. To achieve this, the controller 40 is coupled to one or more valves along fluid paths between the processing chamber 30 and a precursor gas source 50, a reactant gas source 52, a reductant gas source 54, and (optionally) a carrier gas source 56. The controller 40 may also be coupled to one or more optional film monitors 42, an optional temperature monitor 44 (e.g., one or more disposed in the processing chamber 30, and/or in the substrate holder 32), an optional heater 34, an exhaust port 36, and an optional motor 38 (e.g., to rotate the substrate 20 and improve film uniformity). For example, the controller 40 may be configured to control the optional heater 34 in order to maintain the temperature of the substrate 20 at or below a desired temperature using the optional temperature monitor 44 (e.g., about 300° C. or less).

The controller 40 may be configured to analyze the data collected by the sensor(s) and provide feedback to control various process parameters and components of the processing chamber 30. The controller 40 may use or analyze the sensor data to determine when to end one or more steps of the methods described herein. For example, controller 40 may receive data from a residual gas analyzer to detect an endpoint of a film deposition process. In another example, controller 40 may utilize spectroscopic ellipsometry to detect an average film thickness of the film being deposited on the substrate 20 during rotation and provide an indication of the change in film thickness during the process. In another example, controller 40 may utilize spectroscopic ellipsometry to detect the refractive index of the film being deposited on the substrate during rotation and provide an indication of the change in film composition during the ALD process. In some embodiments, controller 40 may automatically end the deposition process when a desired film thickness is achieved.

The sensor data and the controller 40 may also be utilized to achieve a desired throughput objective. For example, the addition of a reductant gas during the deposition process may advantageously improve film quality. The controller 40 may be configured to optimize the process for increased throughput by increasing flowrate of the reductant gas to allow reduction in exposure time or purge time and increase throughput relative to conventional methods.

The controller 40 may be implemented in a wide variety of manners. In one example, the controller 40 may be a computer (e.g., general purpose computer). In another example, the controller 40 may include one or more programmable integrated circuits that are programmed to provide the functionality described herein. For example, one or more processors (e.g., microprocessor, microcontroller, central processing unit, etc.), programmable logic devices (e.g., complex programmable logic device (CPLD)), field programmable gate array (FPGA), etc.), and/or other programmable integrated circuits can be programmed with software or other programming instructions to implement the functionality described herein for controller 40.

In various embodiments, the software or other programming instructions can be stored in one or more non-transitory computer-readable mediums (e.g., memory storage devices, flash memory, dynamic random access memory (DRAM), reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented as maybe apparent to one of ordinary skill in the art.

Figure 8:
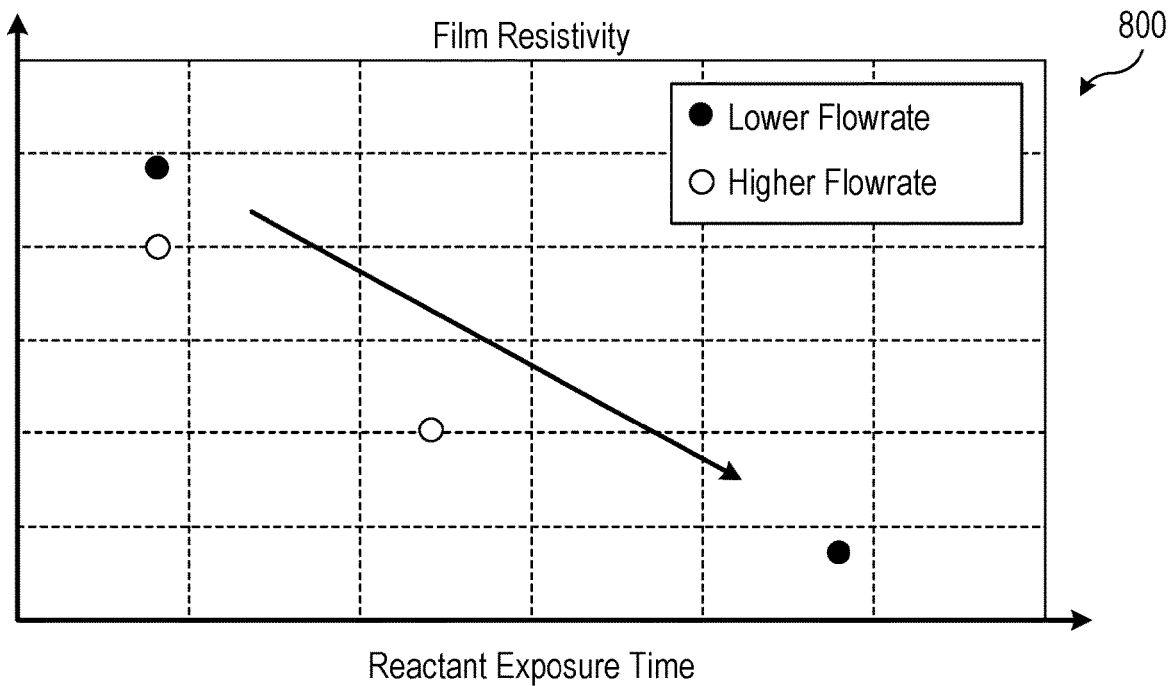
FIG. 8 illustrates a qualitative example graph of film resistivity as a function of reactant gas exposure time in accordance with embodiments of the invention.

FIG. 8 illustrates a qualitative example graph of film resistivity as a function of reactant gas exposure time in accordance with embodiments of the invention. Referring to FIG. 8, the graph 800 shows film resistivity (e.g., for TiN films deposited using alternating exposures of $TiCl_4$ and $N_2H_4$) as a function of exposure time for reactant gas flows (e.g., $N_2H_4$) at a lower flow rate (e.g., 500 sccm (standard cubic centimeters per minute)) and at a higher flow rate (e.g., 2000 sccm). The reductant gas is provided during some or all of the steps of each cycle, e.g., $H_2$ gas during a $TiCl_4$ flow, a $N_2H_4$ flow, and/or purge flows. The substrate temperature may be maintained at a lower temperature, such as about 280° C. The graph 800 shows that increasing the reactant exposure time (e.g., from about 0.5 s to about 2.5 s) lowers the resistivity (e.g., from about 550 μΩ·cm to about 350 μΩ·cm, or by about 60%, in the context of a specific example).

Of course, the graph 800 is intended to be qualitative in nature. Specific values are given as an example and will vary depending on a variety of factors that are specific to a given application. For example, the precursor, reactant, reductant, and/or the carrier gas may be different. Flow rates may be higher or lower and may be tuned to achieve a particular result. Similarly, exposure times may be longer or shorter. The beneficial result, such as film resistivity here, may improve at a different rate relative to the change in exposure time.

Figure 9:
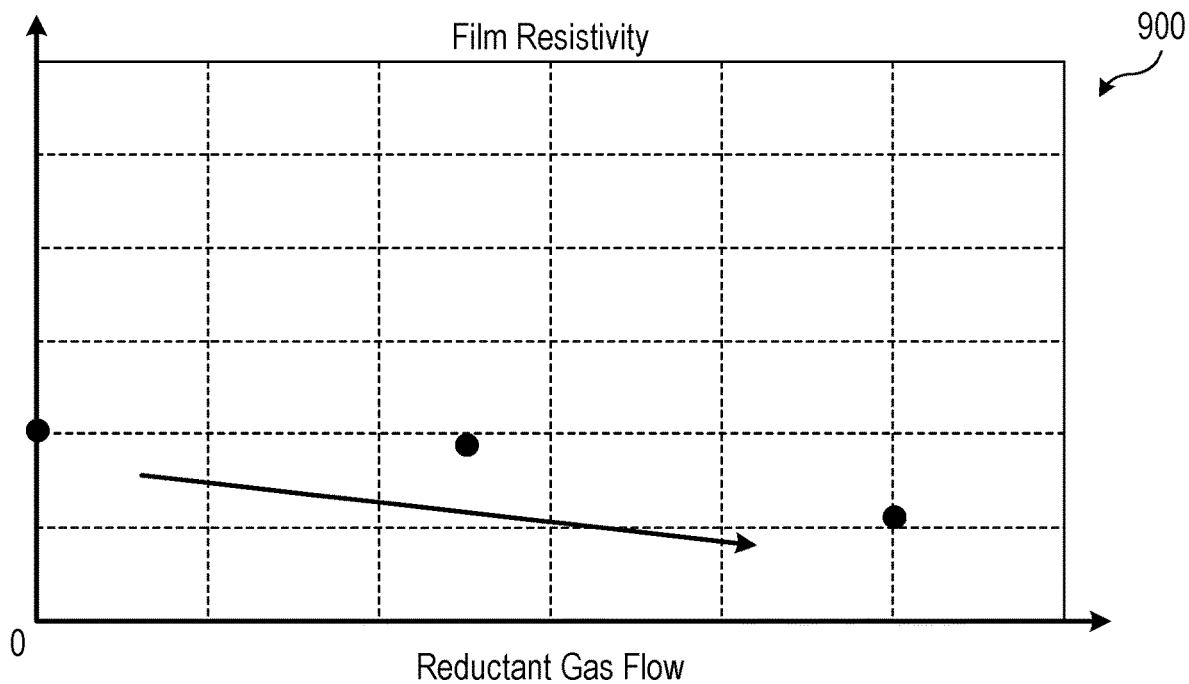
FIG. 9 illustrates a qualitative example graph of film resistivity as a function of reductant gas flow rate in accordance with embodiments of the invention.

FIG. 9 illustrates a qualitative example graph of film resistivity as a function of reductant gas flow rate in accordance with embodiments of the invention. Referring to FIG. 9, a graph 900 shows film resistivity (e.g., for TiN films deposited using alternating exposures of $TiCl_4$ and $N_2H_4$), as a function of reductant gas flowrate (e.g., $H_2$ gas during a $TiCl_4$ flow, a $N_2H_4$ flow, and/or purge flows). The substrate temperature may be maintained at a lower temperature (e.g., about 280° C.). The graph 900 shows that increasing the flowrate of the reductant gas (e.g., from about 0 sccm to about 1000 sccm) lowers the resistivity of the film (e.g., from about 400 μΩ·cm to about 350 μΩ·cm, or about 10%, the context of a specific example).

As before, the graph 900 is also intended to be qualitative in nature. Specific values are given as an example and will vary depending on a variety of factors that are specific to a given application. For example, the precursor, reactant, reductant, and/or the carrier gas may be different. Flow rates may be higher or lower and may be tuned to achieve a particular result. The beneficial result, such as film resistivity here, may improve at a different rate relative to the change in reductant gas flow.

Figure 10:
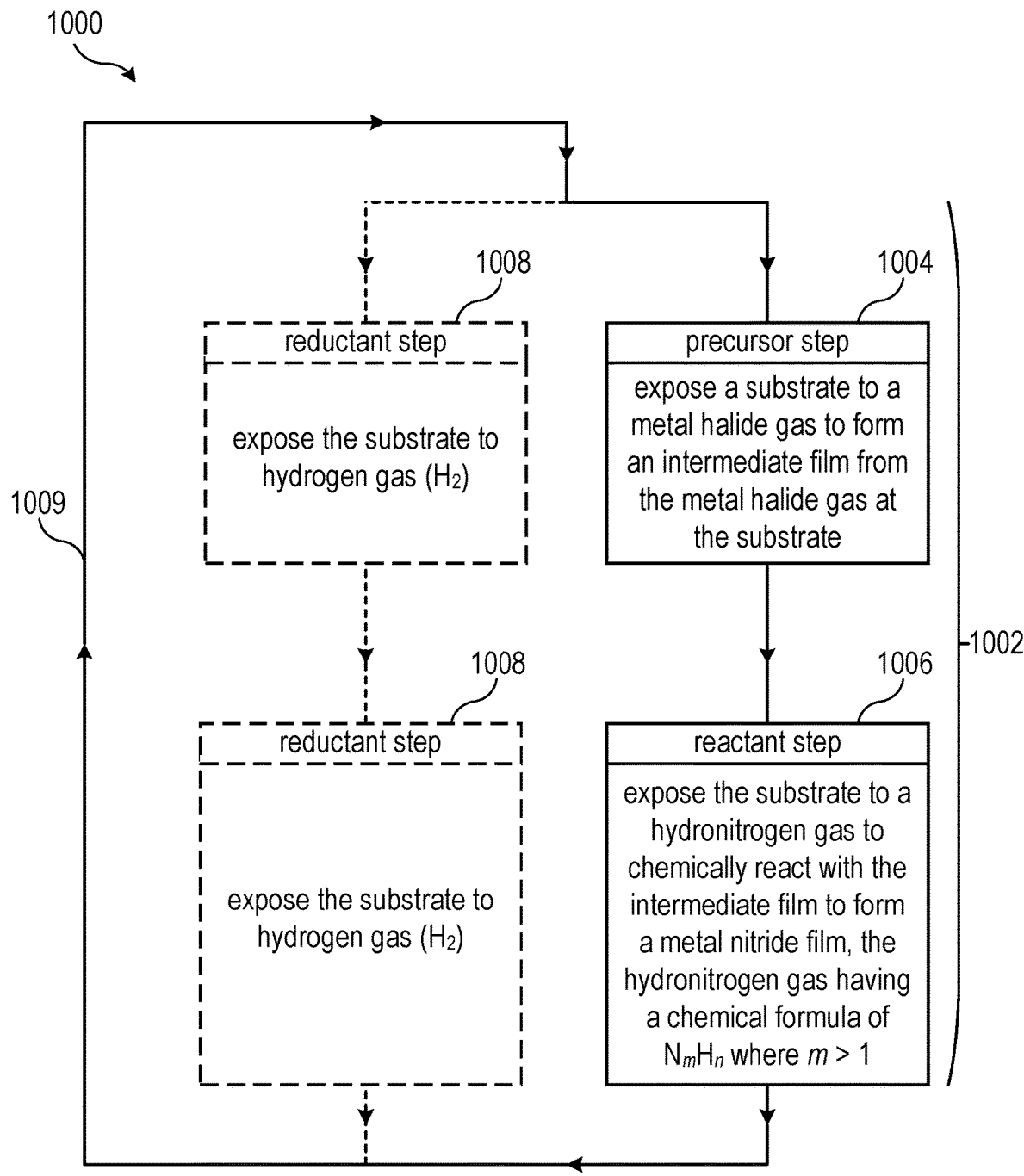
FIG. 10 illustrates an example method for depositing a nitride film in accordance with embodiments of the invention.

FIG. 10 illustrates an example method for depositing a nitride film in accordance with embodiments of the invention. The method of FIG. 10 may be combined with other methods and performed using the systems and apparatuses as described herein. For example, the method of FIG. 10 may be combined with any of the embodiments of FIGS. 1-5, 7, 9, and 11-12. Although shown in a logical order, the arrangement and numbering of the steps of FIG. 10 are not intended to be limited. The method steps of FIG. 10 may be performed in any suitable order or concurrently with one another as may be apparent to a person of skill in the art.

Referring to FIG. 10, a method 1000 for depositing a metal nitride film on a substrate disposed in a processing chamber includes repeating 1009 a cycle 1002. The cycle 1002 includes a precursor step 1004 of exposing the substrate to a metal halide gas to form an intermediate film from the metal halide gas at the substrate and a reactant step 1006 of exposing the substrate to a hydronitrogen gas to chemically react with the intermediate film to form the metal nitride film. The hydronitrogen gas has a chemical formula of $N_mH_n$ where m>1. The method 1000 further includes a reductant step 1008 of exposing the substrate to hydrogen gas (H 2) during at least a portion of each cycle 1002.

Figure 11:
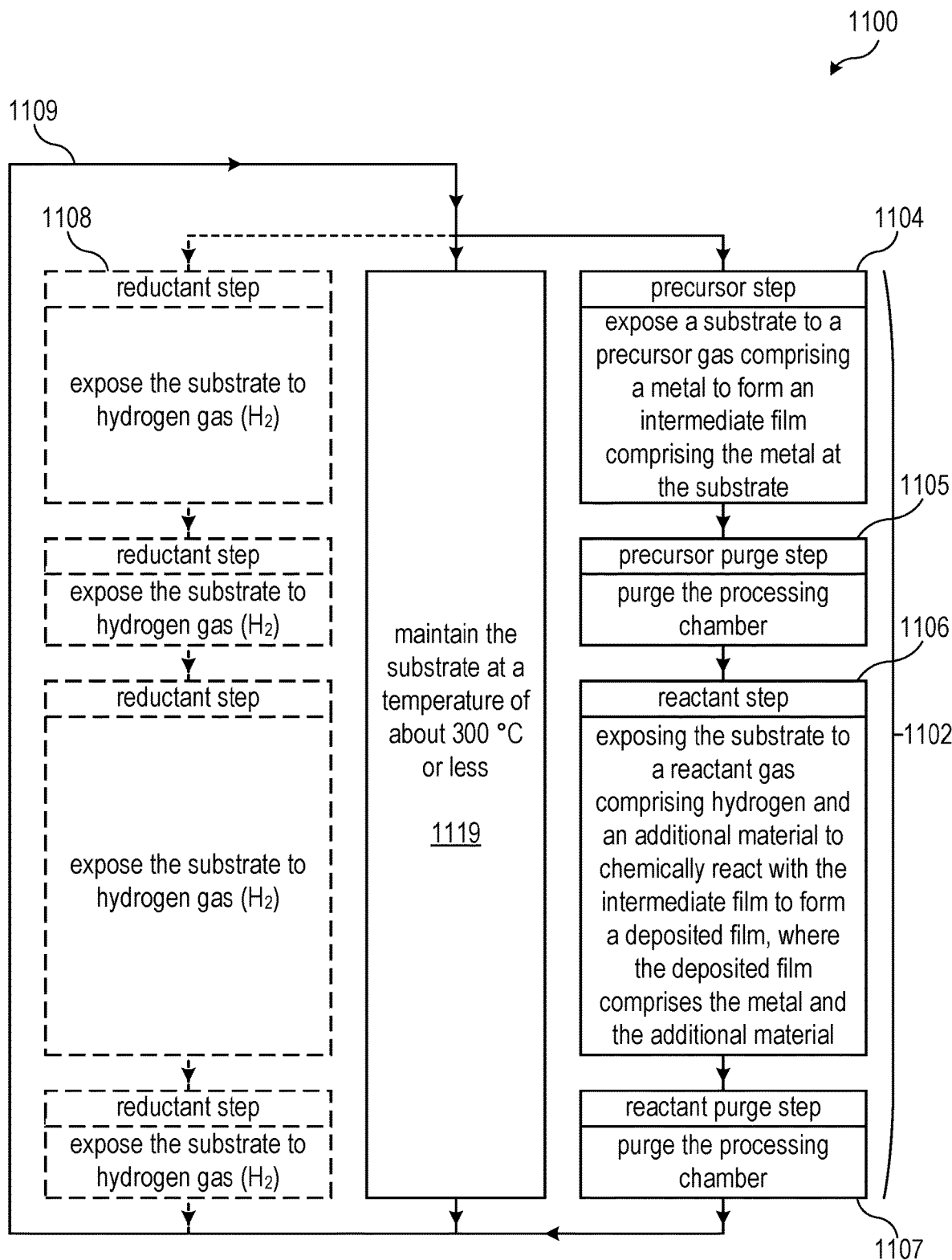
FIG. 11 illustrates an example method for depositing a film in accordance with embodiments of the invention.

FIG. 11 illustrates an example method for depositing a film in accordance with embodiments of the invention. The method of FIG. 11 may be combined with other methods and performed using the systems and apparatuses as described herein. For example, the method of FIG. 11 may be combined with any of the embodiments of FIGS. 1-5, 7, 9-10, and 12. Although shown in a logical order, the arrangement and numbering of the steps of FIG. 11 are not intended to be limited. The method steps of FIG. 11 may be performed in any suitable order or concurrently with one another as may be apparent to a person of skill in the art.

Referring to FIG. 11, a method 1100 for depositing a film on a substrate disposed in a processing chamber includes repeating 1109 a cycle 1102. The cycle 1102 includes a precursor step 1104 of exposing the substrate to a precursor gas comprising a metal to form an intermediate film comprising the metal at the substrate, a precursor purge step 1105 of purging the processing chamber after the precursor step, a reactant step 1106 of exposing the substrate to a reactant gas comprising hydrogen and an additional material to chemically react with the intermediate film to form a deposited film, and a reactant purge step 1107 of purging the processing chamber after the reactant step. The deposited film comprises the metal and the additional material.

The method 1100 further includes a reductant step 1108 of exposing the substrate to hydrogen gas ($H_2$) during at least a portion of each cycle 1102, and maintaining temperature in step 1119 at a temperature of about 300° C. or less for the duration of each cycle 1102.

Figure 12:
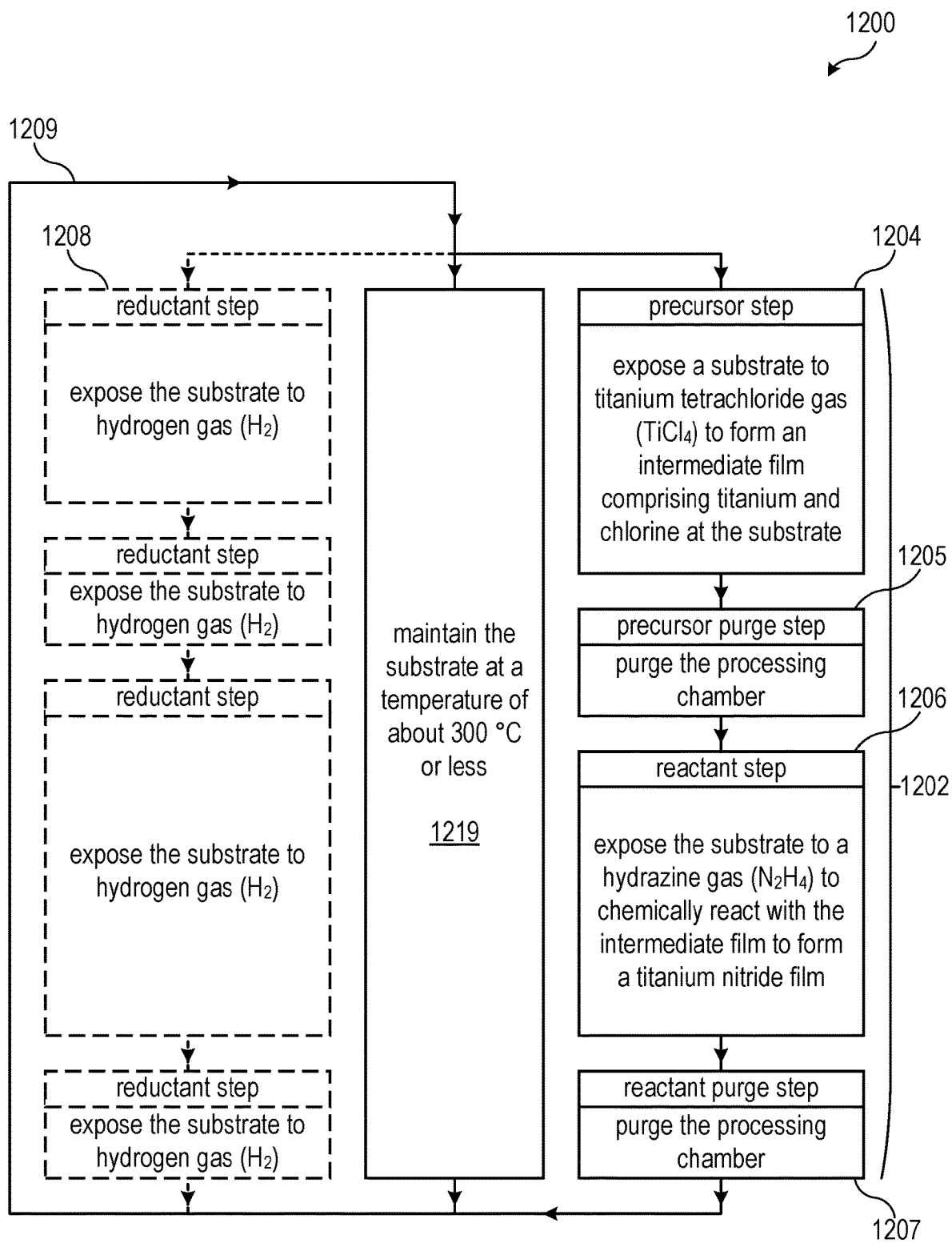
FIG. 12 illustrates an example method for depositing a titanium nitride film in accordance with embodiments of the invention.

FIG. 12 illustrates an example method for depositing a titanium nitride film in accordance with embodiments of the invention. The method of FIG. 12 may be combined with other methods and performed using the systems and apparatuses as described herein. For example, the method of FIG. 12 may be combined with any of the embodiments of FIGS. 1-5, 7, and 9-11. Although shown in a logical order, the arrangement and numbering of the steps of FIG. 12 are not intended to be limited. The method steps of FIG. 12 may be performed in any suitable order or concurrently with one another as may be apparent to a person of skill in the art.

Referring to FIG. 12, a method 1200 for depositing a titanium nitride film on a substrate disposed in a processing chamber includes repeating 1209 a cycle 1202. The cycle 1202 includes a precursor step 1204 of exposing the substrate to titanium tetrachloride gas ($TiCl_4$) to form an intermediate film comprising titanium and chlorine at the substrate, a precursor purge step 1205 of purging the processing chamber after the precursor step, a reactant step 1206 of exposing the substrate to a hydrazine gas ($N_2H_4$) to chemically react with the intermediate film to form the titanium nitride film, and a reactant purge step 1207 of purging the processing chamber after the reactant step.

The method 1200 further includes a reductant step 1208 of exposing the substrate to hydrogen gas ($H_2$) during at least a portion of each cycle 1202 and maintaining temperature in step 1219 at a temperature of about 300° C. or less for the duration of each cycle 1202.

Example embodiments of the invention are summarized here. Other embodiments can also be understood from the entirety of the specification as well as the claims filed herein.

Example 1. A method for depositing a metal nitride film on a substrate disposed in a processing chamber, the method comprising: repeating a cycle comprising a precursor step of exposing the substrate to a metal halide gas to form an intermediate film from the metal halide gas at the substrate, and a reactant step of exposing the substrate to a hydronitrogen gas to chemically react with the intermediate film to form the metal nitride film, the hydronitrogen gas having a chemical formula of $N_mH_n$ where m>1; and a reductant step of exposing the substrate to hydrogen gas ($H_2$) during at least a portion of each cycle.

Example 2. The method of example 1, wherein the reductant step is performed only during the precursor step of the cycle.

Example 3. The method of one of examples 1 and 2, wherein the cycle further comprises a precursor purge step of purging the processing chamber using a purge gas after the precursor step.

Example 4. The method of one of examples 1 to 3, wherein the cycle further comprises a reactant purge step of purging the processing chamber using a purge gas after the reactant step.

Example 5. The method of one of examples 3 and 4, wherein the reductant step is only performed during at least one of the precursor step and the reactant purge step.

Example 6. The method of example 5, wherein the reductant step is only performed during the reactant purge step.

Example 7. The method of one of examples 3 and 4, wherein the purge gas is argon (Ar).

Example 8. The method of one of examples 3 and 4, wherein the purge gas is nitrogen ($N_2$).

Example 9. The method of one of examples 1 to 8, further comprising: flowing a carrier gas into the processing chamber during at least a portion of the cycle.

Example 10. The method of example 9, wherein the carrier gas is argon gas (Ar).

Example 11. The method of example 9, wherein the carrier gas is nitrogen gas ($N_2$).

Example 12. The method of one of examples 1 to 11, wherein the metal halide gas comprises titanium.

Example 13. The method of one of examples 1 to 12, wherein the metal halide gas comprises tantalum.

Example 14. The method of one of examples 1 to 13, wherein the metal halide gas comprises chlorine.

Example 15. The method of example 14, wherein the metal halide gas is titanium tetrachloride ($TiCl_4$).

Example 16. The method of one of examples 1 to 14, wherein the metal halide gas comprises bromine.

Example 17. The method of one of examples 1 to 16, wherein the hydronitrogen gas is a noncyclic azane where n=m+2.

Example 18. The method of example 17, wherein the hydronitrogen gas is hydrazine ($N_2H_4$).

Example 19. The method of example 17, wherein the hydronitrogen gas is triazane ($N_3H_5$).

Example 20. The method of one of examples 1 to 19, further comprising: maintaining the substrate at a temperature of about 300° C. or less for the duration of each cycle.

Example 21. A method for depositing a film on a substrate disposed in a processing chamber, the method comprising: repeating a cycle comprising a precursor step of exposing the substrate to a precursor gas comprising a metal to form an intermediate film comprising the metal at the substrate, a precursor purge step of purging the processing chamber after the precursor step, a reactant step of exposing the substrate to a reactant gas comprising hydrogen and an additional material to chemically react with the intermediate film to form a deposited film, wherein the deposited film comprises the metal and the additional material, and a reactant purge step of purging the processing chamber after the reactant step; a reductant step of exposing the substrate to hydrogen gas (H 2) during at least a portion of each cycle; and maintaining the substrate at a temperature of about 300° C. or less for the duration of each cycle.

Example 22. The method of example 21, wherein the precursor gas comprises titanium.

Example 23. The method of one of examples 21 and 22, wherein the precursor gas comprises aluminum.

Example 24. The method of one of examples 21 to 23, wherein the reactant gas is hydrazine ($N_2H_4$).

Example 25. The method of one of examples 21 to 23, wherein the reactant gas is water vapor.

Example 26. The method of one of examples 21 to 23, wherein the reactant gas is hydrogen peroxide ($H_2O_2$).

Example 27. A method for depositing a titanium nitride film on a substrate disposed in a processing chamber, the method comprising: repeating a cycle comprising a precursor step of exposing the substrate to titanium tetrachloride gas ($TiCl_4$) to form an intermediate film comprising titanium and chlorine at the substrate, a precursor purge step of purging the processing chamber after the precursor step, a reactant step of exposing the substrate to a hydrazine gas ($N_2H_4$) to chemically react with the intermediate film to form the titanium nitride film, and a reactant purge step of purging the processing chamber after the reactant step; a reductant step of exposing the substrate to hydrogen gas (H 2) during at least a portion of each cycle; and maintaining the substrate at a temperature of about 300° C. or less for the duration of each cycle.

Example 28. The method of example 27, wherein the reductant step is performed only during at least one of the precursor step and the reactant purge step.

Example 29. The method of example 28, wherein the reductant step is performed only during the precursor step.

Example 30. The method of one of examples 27 to 29, wherein the temperature is about 280° C.

Example 31. The method of one of examples 27 to 30, wherein the titanium nitride film has a resistivity of about 350 µΩ·cm or less.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for depositing a metal nitride film on a substrate disposed in a processing chamber, the method comprising:
    repeating a cycle comprising
        a precursor step of exposing the substrate to a metal halide gas to form an intermediate film from the metal halide gas at the substrate, and
        a reactant step of exposing the substrate to a hydronitrogen gas to chemically react with the intermediate film to form the metal nitride film, the hydronitrogen gas having a chemical formula of $N_mH_n$ where m>1; and
    a reductant step of exposing the substrate to plasma-less hydrogen gas ($H_2$) during at least a portion of each cycle.

2. The method of claim 1, wherein the reductant step is performed only during the precursor step of the cycle.

3. The method of claim 1, wherein the cycle further comprises at least one of
    a precursor purge step of purging the processing chamber using a purge gas after the precursor step, and
    a reactant purge step of purging the processing chamber using a purge gas after the reactant step.

4. The method of claim 3, wherein the reductant step is only performed during at least one of the precursor step and the reactant purge step.

5. The method of claim 4, wherein the reductant step is only performed during the reactant purge step.

6. The method of claim 1, wherein the metal halide gas comprises titanium.

7. The method of claim 1, wherein the metal halide gas comprises tantalum.

8. The method of claim 1, wherein the metal halide gas comprises chlorine.

9. The method of claim 8, wherein the metal halide gas is titanium tetrachloride ($TiCl_4$).

10. The method of claim 1, wherein the metal halide gas comprises bromine.

11. The method of claim 1, wherein the hydronitrogen gas is hydrazine ($N_2H_4$).

12. The method of claim 1, wherein the hydronitrogen gas is triazane ($N_3H_5$).

13. A method for depositing a film on a substrate disposed in a processing chamber, the method comprising:
repeating a cycle comprising
a precursor step of exposing the substrate to a precursor gas comprising a metal to form an intermediate film comprising the metal at the substrate,
a precursor purge step of purging the processing chamber after the precursor step,
a reactant step of exposing the substrate to a reactant gas comprising hydrogen and an additional material to chemically react with the intermediate film to form a deposited film, wherein the deposited film comprises the metal and the additional material, and
a reactant purge step of purging the processing chamber after the reactant step;
a reductant step of exposing the substrate to plasma-less hydrogen gas ($H_2$) during at least a portion of each cycle; and
maintaining the substrate at a temperature of about 300° C. or less for the duration of each cycle.

14. The method of claim 13, wherein the precursor gas comprises titanium.

15. The method of claim 13, wherein the precursor gas comprises aluminum.

16. The method of claim 13, wherein the reactant gas is hydrazine ($N_2H_4$).

17. The method of claim 13, wherein the reactant gas is water vapor.

18. The method of claim 1, wherein each cycle is performed without exciting plasma.

19. The method of claim 1, further comprising:
maintaining the substrate at a temperature of about 300° C. or less for the duration of each cycle.

20. A method for depositing a metal nitride film on a substrate disposed in a processing chamber, the method comprising:
repeating a cycle comprising
a precursor step of exposing the substrate to a metal halide gas to form an intermediate film from the metal halide gas at the substrate, and
a reactant step of exposing the substrate to a hydronitrogen gas to chemically react with the intermediate film to form the metal nitride film, the hydronitrogen gas having a chemical formula of $N_mH_n$ where m>1; and
a reductant step of exposing the substrate to hydrogen gas ($H_2$) performed only during the precursor step of each cycle.

* * * * *